(12) United States Patent
Van Gorkom et al.

(10) Patent No.: US 8,258,532 B2
(45) Date of Patent: Sep. 4, 2012

(54) COLLIMATING LIGHT EMITTING APPARATUS AND METHOD

(75) Inventors: Ramon Pascal Van Gorkom, Eindhoven (NL); Michel Cornelis Josephus Marie Vissenberg, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 34 days.

(21) Appl. No.: 12/742,957

(22) PCT Filed: Nov. 13, 2008

(86) PCT No.: PCT/IB2008/054759
§ 371 (c)(1),
(2), (4) Date: May 14, 2010

(87) PCT Pub. No.: WO2009/066209
PCT Pub. Date: May 28, 2009

(65) Prior Publication Data
US 2010/0289039 A1    Nov. 18, 2010

(30) Foreign Application Priority Data

Nov. 20, 2007  (EP) .................................... 07121092

(51) Int. Cl.
*H01L 33/50* (2010.01)
(52) U.S. Cl. .............................. 257/98; 257/99; 257/100
(58) Field of Classification Search ............. 257/98–100
See application file for complete search history.

(56) References Cited

U.S. PATENT DOCUMENTS

| 6,607,286 | B2 | 8/2003 | West et al. |
| 7,293,908 | B2 * | 11/2007 | Beeson et al. ................. 362/612 |
| 7,652,301 | B2 * | 1/2010 | Bierhuizen et al. ............. 257/98 |
| 7,679,281 | B2 * | 3/2010 | Kim et al. ...................... 313/501 |
| 2003/0117798 | A1 | 6/2003 | Leysath et al. |
| 2004/0144987 | A1 * | 7/2004 | Ouderkirk et al. ............. 257/98 |
| 2005/0269582 | A1 | 12/2005 | Mueller et al. |
| 2006/0018122 | A1 | 1/2006 | Negley |
| 2006/0076568 | A1 | 4/2006 | Keller et al. |
| 2007/0085105 | A1 | 4/2007 | Beeson et al. |

FOREIGN PATENT DOCUMENTS

WO    2005107420 A2    11/2005

* cited by examiner

*Primary Examiner* — Marcos D. Pizarro
*Assistant Examiner* — Bilkis Jahan
(74) *Attorney, Agent, or Firm* — John F. Salazar; Mark L. Beloborodov

(57) ABSTRACT

Proposed is a light emitting apparatus (1) comprising a light source (5) for emitting light and a collimator (40) for arranging the light emitted in an application specific distribution. The light source comprises (i) a semiconductor device (10) capable of emitting light, (ii) a body (20) having a bottom surface (21) adjacent to the semiconductor device (10) and an opposing top surface (22), and (iii) a reflector (30) positioned adjacent the top surface (22). The light emitting apparatus (1) is characterised in that the reflector (30) has a surface larger than the bottom surface (21) of the body (20). This is especially advantageous for creating a given light beam collimation with a smaller collimator or alternatively for creating a collimator producing a significantly narrower light beam.

1 Claim, 3 Drawing Sheets

COLLIMATING LIGHT EMITTING APPARATUS AND METHOD

FIELD OF THE INVENTION

The invention relates to a light emitting apparatus comprising a light source and a collimator for arranging the light emitted in an application specific distribution, the light source comprising a semiconductor device capable of emitting light, a body having a bottom surface adjacent to the light source and an opposing top surface, and a reflector positioned adjacent the top surface. The invention also relates to a method for collimating light. Such a light emitting apparatus and method are used in particular in general illumination lighting systems.

BACKGROUND OF THE INVENTION

Light emitting devices of the kind set forth are well known and used for instance to create spot lights. The cooperation between the collimator and the light emitting characteristics of the light source essentially determines the application specific light distribution. Market demand for focused spot lights typically prescribes them to have a very small beam, to have a small volume, and to have a small exit diameter of the collimator.

A drawback of the known light emitting device is that some light rays emitted by the light source exit the apparatus without interacting with (f.i. reflecting from) the collimator. This results in a fairly large beam divergence and hence a low focussing efficiency. Enlarging (the length of) the collimator forms the classical approach to solve this problem. This, however, clearly contradicts the market requirement of small volume and exit diameter.

Therefore, a clear need exist for the availability of a light emitting apparatus having a small volume and exit diameter while creating a collimated light beam with high efficiency.

SUMMARY OF THE INVENTION

It is an object of the present invention to provide a light emitting apparatus of the kind set forth which has an improved ratio of volume and exit diameter characteristics to collimated light beam characteristics. The invention achieves this objective according to a first aspect with the light emitting apparatus as defined in claim 1. This apparatus is characterised in that the reflector has a surface larger than the bottom surface of the body. Advantageously, this allows for creating a given light beam collimation with a smaller collimator, or—alternatively—for creating a collimator producing a significantly narrower light beam.

The invention provides a light emitting apparatus having the advantage that it allows to make a much shorter collimator for the same amount of collimation. Alternatively, the same collimator size realizes a better collimation. Essentially, the boundary light ray that still just interacts with the collimator determines the required collimator length. Providing a reflector having a surface larger than the bottom surface of the body reduces the solid angle in which the light source emits light. Advantageously, the reflector essentially defines the solid angle. Matching the collimator to the reduced solid angel results in a smaller collimator volume and exit diameter. Consequently, especially applications requiring a highly collimated beam benefit from the invention, as these otherwise necessarily require a very long collimator, i.e. in the same order of magnitude of the length of a compound parabolic concentrator.

In an embodiment of the present invention the body has a side surface at least part of which is at an oblique angle with respect to the bottom surface. In an embodiment of a light emitting device the oblique angle is smaller than 90°. Advantageously, the oblique angle creates a larger top surface of the body. This top surface may provide a support for the reflector.

In an embodiment of the light emitting apparatus the body comprises a wavelength converting material. Advantageously, this allows converting at least a part of the primary light emitted by the semiconductor device into secondary light having a different wavelength. In an embodiment the wavelength converting body is provided as a ceramic body. Advantageously, luminescent ceramic bodies are robust and show a low sensitivity to temperature changes.

In an embodiment the light emitting apparatus comprises at least a second light source. Advantageously, this allows controlling the lumen flux generateable by the apparatus given a predetermined light source flux. Additionally, it allows colour control of the light emitted by the apparatus in case the second light source emits a different spectrum than the first.

In an embodiment, the reflector surface is arranged in dependence on the light source position relative to the collimator. Advantageously, this allows matching the solid angles of the individual light sources to the collimator. Consequently, given a predefined collimator length and exit diameter, arranging the reflector surface of the individual light sources in dependence of their position assures an optimal overlap of the combined solid angel of the light sources with that of the collimator.

According to a second aspect, the invention provides a method for collimating light, comprising the steps providing a light source for emitting light and comprising a semiconductor device, a body, and a reflector adjacent a top surface of the body, and providing a collimator for arranging the light emitted in an application specific distribution, the method characterised in that it comprises the step of arranging the reflector to have a surface larger than a bottom surface of the body.

These and other aspects of the invention will be apparent from and elucidated with reference to the embodiments described hereinafter.

BRIEF DESCRIPTION OF THE DRAWINGS

Further details, features and advantages of the invention are disclosed in the following description of exemplary and preferred embodiments in connection with the drawings.

DETAILED DESCRIPTION OF THE EMBODIMENTS

Figure 1:
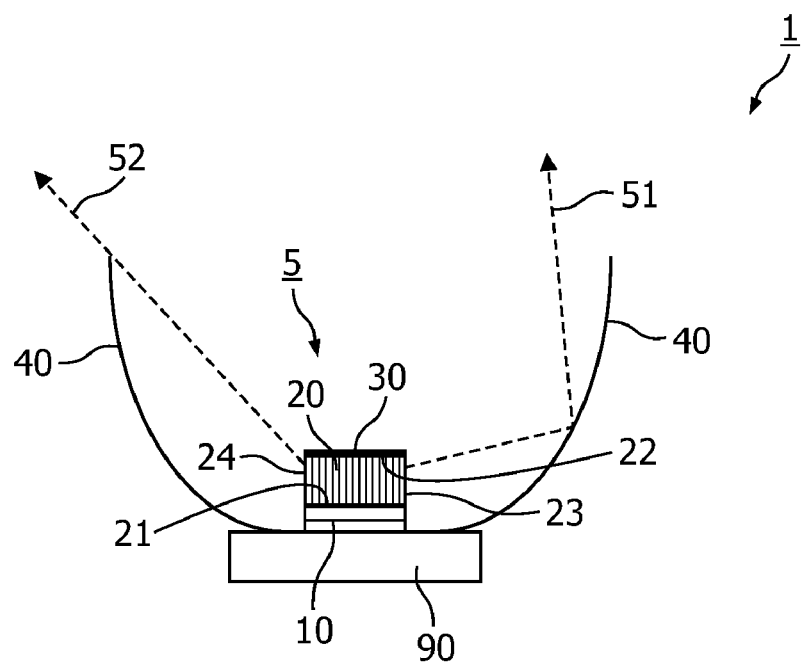
FIG. 1 shows a light emitting apparatus according to the prior art.

FIG. 1 shows a light emitting apparatus 1 according to the prior art. It comprises a light source 5, a base 90 to which the light source is connected, and a collimator 40 for arranging the light emitted in an application specific distribution. The base 90 may have additional functions such as providing a mechanical interface for building the apparatus 1 into a construction, a thermal interface for dissipating heat generated by the light source 5 to the environment, and an electrical interface for providing power and control signals to the light source 5. The collimator 40 typically comprises a high grade reflecting surface, often an aluminized film, on a supporting structure having an appropriate shape to realise the desired application specific light distribution.

Light source 5 comprises a semiconductor device 10, a body 20, and a reflector 30. The semiconductor device 10 typically comprises a LED capable of generating light. The body 20 has a bottom surface 21 adjacent to the semiconductor device and an opposing top surface 22. Preferably it provides a predefined spectral output by (partially) converting the wavelength of the light emitted. Often it includes a wavelength converting material such as a phosphor. Typically these materials are based on Yttrium Aluminium Garnet (YAG), Yttrium Aluminium Silicon Oxo-Nitrides (YSN), Silicon Aluminium Oxo-Nitrides (SiAlON) or Lutetium Aluminium Garnet (LuAG). Converting the 'primary' light emitted by III-nitride LEDs into 'secondary' light having a longer peak wavelength than the 'primary' light by using the above described materials forms a well known art. The wavelength converting material can be chosen to obtain a particular peak wavelength of the 'secondary' light. Furthermore, the size and thickness of the body and/or the concentration of the wavelength converting material can be chosen such that the light emitted by the apparatus 1 is either a mixture of 'primary' and 'secondary' light or substantially consists of only the 'secondary' light. Preferably the wavelength converting body is provided as a luminescent ceramic body.

Finally, the reflector 30 is positioned adjacent the top surface 22 of the body 20. Typically the body 20 constitutes a volume light emitter in the form of a cube or platelet having side surfaces 23, 24 at right angles with the bottom 21 and top 22 surfaces. Reflecting the light generated in (and transmitted through) the body 20, the reflector 30 causes it to be emitted through the side surfaces 23, 24. Beneficially, this allows most of the light ray 51 to be arranged in an application specific distribution by the collimator 40. Absence of the reflector 30 would allow most of the light to be emitted through the top surface 22 and to exit the collimator 40 without interaction. With the reflector 30 in place, however, still a considerable portion—such as light ray 52—will exit the collimator 40 without interaction. These light rays 52 will detriment the desired light distribution. The classical solution to minimise this problem is extending the collimator 40 in size. This however causes the volume and exit diameter of the collimator 40 to increase considerably and often to a point beyond market requirements.

Figure 2:
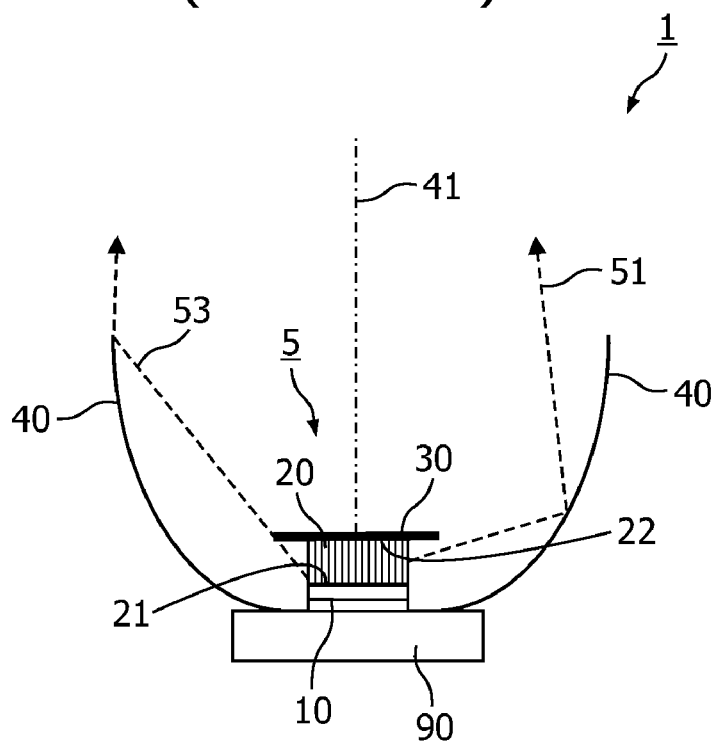
FIG. 2 shows an embodiment according to the invention.

The invention offers a solution by providing a light emitting apparatus 1 of the kind set forth characterized in that the reflector 30 has a surface larger than the bottom surface 21 of the body 20. In this way the reflector 30 extends beyond the body 20 (see FIG. 2). This enables blocking the light rays 52 (as indicated in FIG. 1) and causes the light emitted by the light source 5 to interact with the collimator 40, as indicated by the light rays 51 & 53 in FIG. 2. Here light ray 53 constitutes the boundary ray, still just interacting with the collimator. Advantageously, the invention allows to make a much shorter collimator 40 (lower volume, smaller exit diameter) for the same amount of collimation. Alternatively, the same collimator 40 size realizes a better collimation. Thus, providing a reflector 30 having a surface larger than the bottom surface 21 of the body 20 reduces the solid angle in which the light source 5 emits light. Advantageously, the reflector 30 essentially defines this solid angle. Matching the collimator 40 to this (reduced) solid angel results in a smaller collimator volume and exit diameter. Consequently, especially applications requiring a highly collimated beam benefit from the invention, as these otherwise necessarily require a very long collimator, i.e. in the same order of magnitude of the length of a compound parabolic concentrator.

Figure 3:
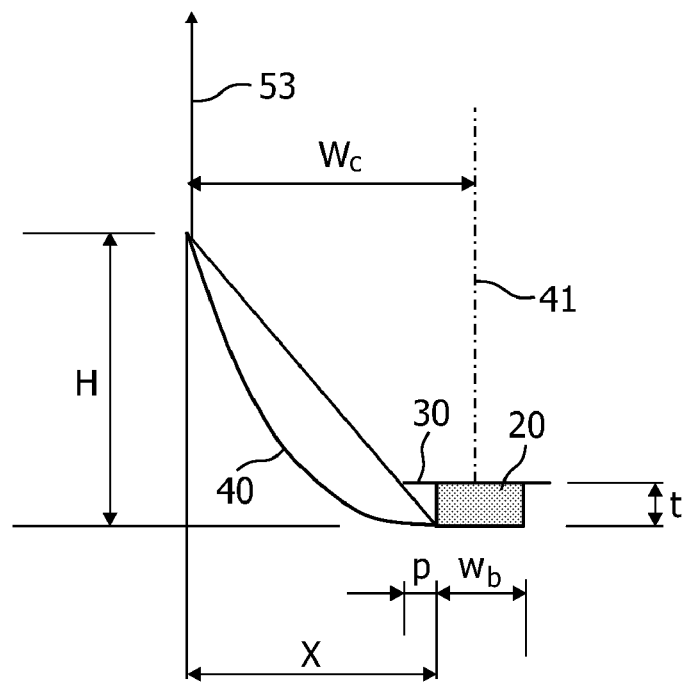
FIG. 3 shows a schematic (partial) cross section through an embodiment of the invention.

FIG. 3 shows a schematic (partial) cross section through an embodiment of the invention. As can be discerned from the figure, the collimator 40 has a height H and a width $W_C$. Furthermore X defines the distance perpendicular to the optical axis 41 of the collimator 40 between the bottom of the body 20 and the top of the collimator. Hence, $2X=2W_C-w_b$, with $w_b$ the width of the body and when the body is placed on symmetrically on the optical axis 41. Moreover, the reflector 30 extends a distance p beyond the bottom surface 21 of the body 20. Finally, the body has a thickness t defining the distance between the bottom 21 and top 22 surfaces of the body. In an embodiment of the invention, the collimator 40 has a height H depending on the width X such that the light rays emitted by the body 20 interact with the collimator. This will be the case if $H \geq Xt/p$.

In an embodiment the collimator 40 is a parabolic shaped reflector. It may also be a conical or pyramidal shaped (or any other shape known in the art). Although above it has been indicated that the collimator 40 has an exit diameter allowing the light generated to exit the light emitting apparatus 1—indicating a circular cross section perpendicular to the optical axis 41 of the collimator 40—the collimator may in fact have a non-circular cross section, such as a polygon or ellipse. It is noted that the reflector 30 preferably has a cross section congruent with that of the collimator 40 in order to optimally match the solid angle over which the light emitted by the light source 5 interacts with the collimator 40. This creates an efficient optical design. The collimator 40 may be smoothly curved. Alternatively, it may be facetted.

Figure 4:
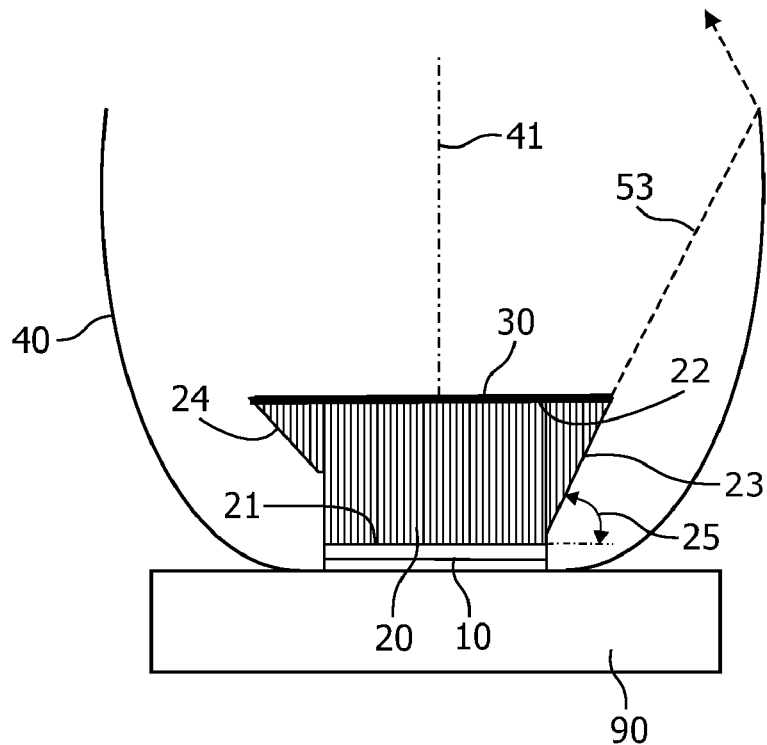
FIG. 4 shows another embodiment according to the invention.

FIG. 4 shows an embodiment according to the invention. In this embodiment the body 20 has a side surface 23, 24 at least part of which is at an oblique angle 25 with respect to the bottom surface 21. In an embodiment of a light emitting device the oblique angle 25 is smaller than 90°. Advantageously, the oblique angle creates a larger top surface 22 of the body 20. This top surface beneficially provides a support for the reflector 30. In an embodiment the oblique angle 25 is arranged to define the solid angle matching the collimator. As the light emitted from the side faces 23, 24 is emitted over a full half sphere ($2\pi$ radians)—the body 20 usually has a index of refraction well above 1—a light ray escaping the body parallel to its surface preferably corresponds to the boundary ray 53 still interacting with the collimator 40. In such an embodiment the oblique side surface 23 connects the bottom 21 and top 22 surfaces in a straight line. Alternatively, when the body 20 has only a part of the side surface 24 at an oblique angle, the boundary ray 53 corresponds to a ray escaping from the side of the body at the bottom surface 21 and just passing the reflector 30. Alternatively, the side surface may be concavely curved (not shown), allowing the support of the reflector 30 while simultaneously defining the boundary ray 53.

Figure 5:
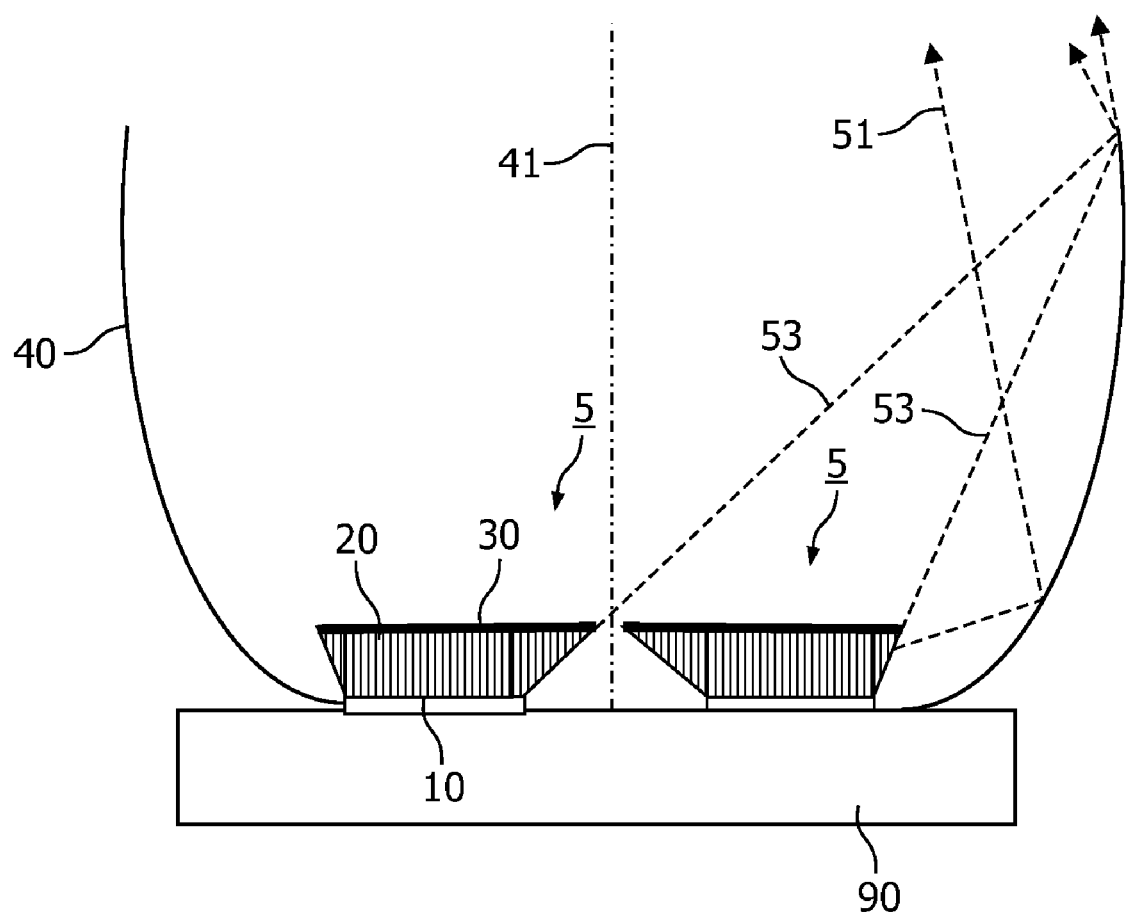
FIG. 5 shows yet another embodiment according to the invention.

In an embodiment of the invention depicted in FIG. 5 the light emitting apparatus 1 comprises at least a second light source 5. Including an appropriate number of light sources 5 allows designing the light emitting apparatus 1 to emit a predetermined light flux. Advantageously, this allows controlling the lumen flux generateable by the apparatus given a fixed (maximum) light source flux.

In an embodiment the reflector 30 surface of a light source 5 is arranged in dependence on the light source position relative to the collimator 40. While the light source will preferably be positioned on the optical axis 41 of the collimator 40 in a light emitting apparatus 1 comprising only a single light source 5, in a multi light source embodiment they will be positioned off-axis. The invention is based on the insight that given the collimator dimensions (height & exit diameter), matching the solid angle in which the light emitted by the individual light sources 5 with the collimator 40 creates an efficient optical design. Essentially, in an embodiment therefore the reflector 30 defines the solid angle of the light sources 5 in dependence to their position relative to the optical axis 41 of the collimator 40. Thus, for each light source the relation $H \geq Xt/p$ can be specifically optimised. In an embodiment the oblique angles 25 of the side faces 23, 24 are arranged in dependence of the light source 5 positions relative to the collimator 40. This results advantageously in a match of the solid angles of emitted light with the collimator, as evidenced by the light rays 53 in FIG. 5.

Although the invention has been elucidated with reference to the embodiments described above, it will be evident that alternative embodiments may be used to achieve the same objective. The scope of the invention is therefore not limited to the embodiments described above, but can also be applied to any other luminary where an application specific light distribution is desired while minimizing the collimator dimensions.

The invention claimed is:

1. A light emitting apparatus, comprising:
a light source surrounded by a upwardly directed collimator, said light source including an LED mounted on a base;
   a body mounted on said LED and including a light converting material, said body having a top surface, side surface and bottom surface, said bottom surface mounted to said base;
   a reflector mounted on said top surface of said body, said reflector extending outward beyond said top surface of said body;
   wherein said side surface of said body including an outward flare extending outward beyond said bottom surface and increasing the area of said top surface beyond a defined area of said bottom surface and said LED;
   wherein said outward flare of said side surface of said body creates an outward flare angle of smaller than about ninety degrees with respect to said bottom surface,
said top surface providing support for said reflector;
wherein said outward flare angle is arranged to define a matching angle with said collimator such that said collimator extends upward at least as far as said matching angle to reflect light emitted by an uppermost portion of said outward flare of said side surface immediately adjacent said reflector.

* * * * *